United States Patent [19]

Landis

[11] Patent Number: 5,004,891
[45] Date of Patent: Apr. 2, 1991

[54] TWO-STAGE METHOD AND APPARATUS FOR GLOSSING A DEVELOPER SHEET

[75] Inventor: Robert A. Landis, Kettering, Ohio

[73] Assignee: The Mead Corporation, Dayton, Ohio

[21] Appl. No.: 338,901

[22] Filed: Apr. 14, 1989

[51] Int. Cl.⁵ .............................................. G03G 15/20
[52] U.S. Cl. .................................... 219/388; 219/216; 355/290
[58] Field of Search ............... 219/469, 470, 471, 216, 219/388; 355/290, 291

[56] References Cited

U.S. PATENT DOCUMENTS

| | | | |
|---|---|---|---|
| 3,053,962 | 9/1962 | Cerasani et al. | 219/216 |
| 3,187,162 | 6/1965 | Hojo et al. | 219/388 |
| 3,219,799 | 11/1965 | Trumbull | 219/216 |
| 3,330,189 | 7/1967 | Vil . | |
| 3,440,944 | 4/1969 | Endermann | 219/388 |
| 3,478,665 | 11/1969 | Umahashi | 219/216 |
| 3,591,276 | 7/1971 | Byrne | 219/216 |
| 3,659,348 | 5/1972 | Frank . | |
| 3,679,302 | 7/1972 | Ludwig . | |
| 3,864,709 | 2/1975 | Bruns | 219/216 |
| 4,163,892 | 8/1979 | Komatsu | 219/216 |
| 4,198,145 | 4/1980 | Scott | 219/216 |
| 4,639,405 | 1/1987 | Franke | 219/216 |
| 4,668,073 | 5/1987 | Hatabe et al. . | |
| 4,745,432 | 5/1988 | Langdon | 219/216 |
| 4,761,311 | 8/1988 | Stone | 219/216 |

Primary Examiner—Teresa J. Walberg
Attorney, Agent, or Firm—Thomas A. Boshinski

[57] ABSTRACT

A method and apparatus glosses a developer sheet which has a resin layer coated on one side thereof which glosses at a predetermined temperature T. The sheet is placed with the resin side thereof in contact with a conductive heating element, preferably a porous belt. Heat is applied to the resin side of the sheet by the heating element to bring the sheet from its ambient temperature to a temperature just below the glossing temperature T.

6 Claims, 2 Drawing Sheets

TWO-STAGE METHOD AND APPARATUS FOR GLOSSING A DEVELOPER SHEET

BACKGROUND OF THE INVENTION

The present invention relates to a method and apparatus for glossing developer sheets. The developer sheet useful in the present invention can be used in conjunction with conventional pressure-sensitive copy paper or photosensitive imaging systems employing microcapsules to provide visible images upon contact with a color precursor which is imagewise released from the microcapsules and transferred to the developer sheet.

Photosensitive imaging systems employing microencapsulated radiation sensitive compositions are the subject of U.S. Pat. Nos. 4,399,209 and 4,416,966, both of which are hereby incorporated by reference. These imaging systems are characterized in that an imaging sheet including a layer of microcapsules containing a photosensitive composition in the internal phase is imagewise exposed to actinic radiation. In the most typical embodiments, the photosensitive composition is a photopolymerizable composition including a polyethylene unsaturated compound and a photoinitiator and is encapsulated with a color precursor. Exposure imagewise hardens the internal phase of the microcapsules.

U.S. Pat. No. 4,399,209 discloses a transfer system in which the imaging sheet is assembled with a developer sheet prior to being subjected to a microcapsule rupturing force. Upon passing through pressure rollers in contact with the developer sheet, the microcapsules rupture and imagewise release the internal phase whereupon the color precursor migrates to the developer sheet where it reacts with a dry developer and forms a color image. Imaging systems can be designed to produce monochromatic or polychromatic full color images.

It is often desirable to produce a glossy surface on the developer sheet. Thus, the sheet may include an overcoating of a finely divided thermoplastic developer material. Upon application of heat to this resin material, the resin coalesces, thereby forming a glossy surface for the developer sheet.

Several approaches to heating the glossy material are known. A conductive heating device is disclosed in U.S. Pat. No. 4,761,311, wherein the developer sheet is passed over a curved, heated platen which applies heat to the sheet. In order to effect movement of the sheet, a continuous belt contacts the resin-coated side of the sheet to move it across the platen. One disadvantage with a conductive heating device is that some contact of the resin coating is required. This contact may damage the hot surface of the resin, leaving pick marks or streaking. The apparatus of U.S. Pat. No. 4,761,311 is designed to minimize pressure on the sheet to avoid such problems but does not eliminate the potential problems.

A second approach is through non-contact heating such as by the direction of forced air against the sheet. Such an approach is disclosed, for example, in commonly-assigned, copending U.S. patent application Ser. No. 155,795, filed Feb. 16, 1988. In such a case, heated air is directed against the surface of the sheet. While the use of heated air produce an effectively defect free glossy surface, heating by air is relatively inefficient, thereby requiring long exposure to the heat. This slows the entire image production process.

What is needed, therefore, is a glossing method and apparatus which can be applied to a developer sheet to achieve high throughput times and a defect free glossy surface. At the same time, it is desirable that the method be relatively simple in its practice and that the apparatus be uncomplicated in its construction.

SUMMARY OF THE INVENTION

In meeting the foregoing needs, the present invention provides a method for glossing a developer sheet having a resin layer coated on one side thereof which glosses at a predetermined temperature T. The invention is based upon the principle that most of the energy required for glossing a developer sheet is required to bring the sheet from its ambient temperature to a temperature just below the softening point of the resin at the temperature T. Contact of the resin layer during such period will not tend to damage the resin layer. Only a final, relatively small amount of heat energy is required to complete the heating of the sheet to the temperature T whereupon the glossy finish is produced. It is only during this latter portion in which contact of the glossing layer should be avoided.

Thus, the method comprises the steps of placing the sheet with the resin side thereof in contact with a conductive heating means. Heat is applied to the resin side of the sheet by the heating element to bring the sheet from its ambient temperature to a temperature just below the glossing temperature T. The resin side of the sheet is removed from contact with the heating means. Heat is then applied to the resin side of the sheet from a non-contact heating source to raise the temperature of the sheet to a temperature at or above the glossing temperature T.

The conductive heating means may be porous to permit the passage of water therethrough which is vaporized by the heating element. The porous conductive heating means may include a porous belt which transports the sheet while simultaneously applying heat to the sheet.

The non-contact heating source may include an air heater and a blower for directing heated air onto the resin side of the sheet. The use of forced air during this final stage leaves a clean, undamaged surface.

Accordingly, it is an object of the present invention to provide a glossing method and apparatus for glossing a developer sheet having a clean, undamaged surface; to provide such a method and apparatus wherein glossing of the sheet occurs within a relatively short dwell period; and to provide such a method and apparatus wherein final glossing of the sheet occurs without the resin surface in contact with another surface.

Other objects and advantages of the present invention will become apparent from the following description, the attached drawings and the appended claims.

DETAILED DESCRIPTION OF THE PREFERRED EMBODIMENT

Figure 1:
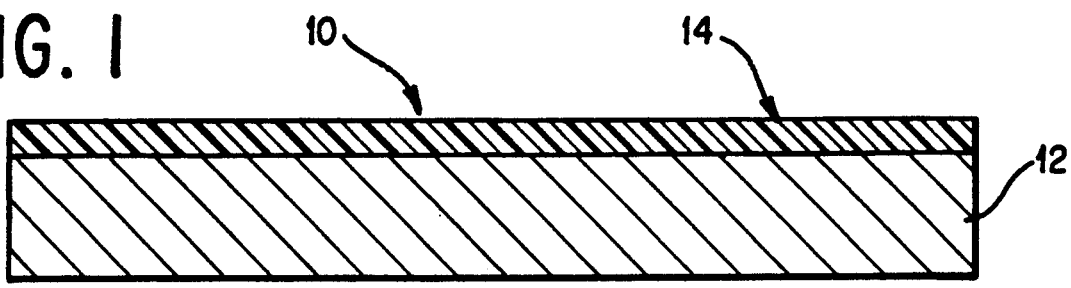
FIG. 1 is a cross-sectional schematic view of a developer sheet useful in the present invention.

A developer sheet used in conjunction with the present invention is schematically shown in FIG. 1, wherein the developer sheet is designated generally by the reference numeral 10. The sheet 10 includes a support 12 which is overcoated by a layer 14 of a finely divided thermoplastic developer resin. Useful materials for the support 12 include both opaque substrates such as paper and transparent substrates such as PET film. Preferably, the support 12 is paper.

The developer sheet is preferably used with a photosensitive media such as that described in U.S. Pat. No. 4,399,209. Upon imagewise transfer of a color precursor to the surface of sheet 10, a visible image 16 is formed in layer 14 as shown by crosshatching. The visible image 16 is usually the product of an acid-base reaction between the color precursor, which is usually an electron donor, and the thermoplastic developer resin, which is usually an electron acceptor.

Figure 2:
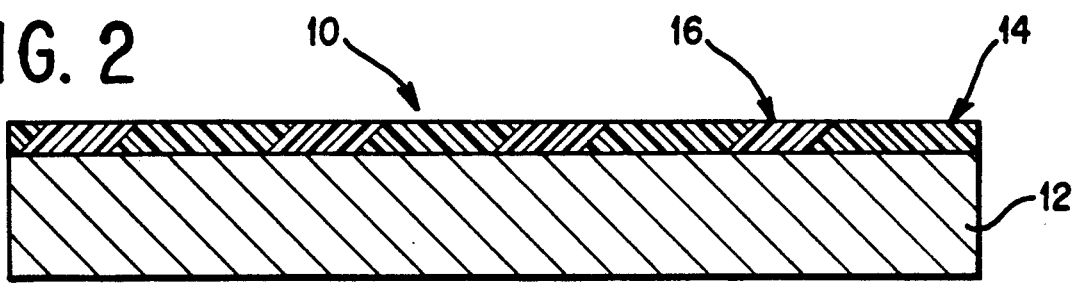
FIG. 2 is a view of the developer sheet of FIG. 1 after image-wise transfer of the color precursor thereto.
Figure 3:
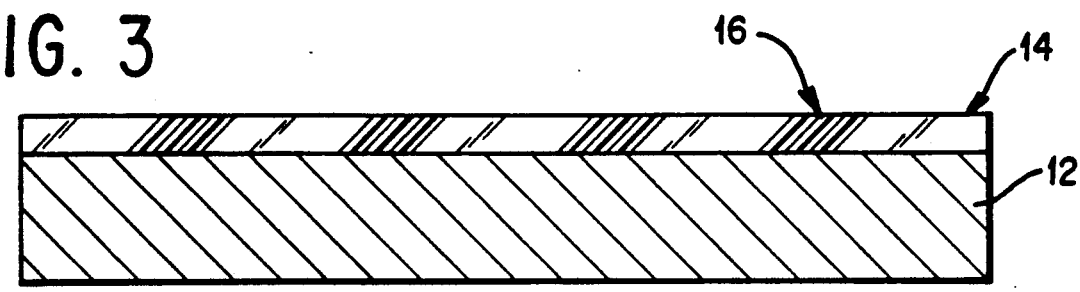
FIG. 3 is a view of the developer sheet of FIG. 2 after coalescing of the thermoplastic developer resin to provide a high gloss finish.
Figure 4:
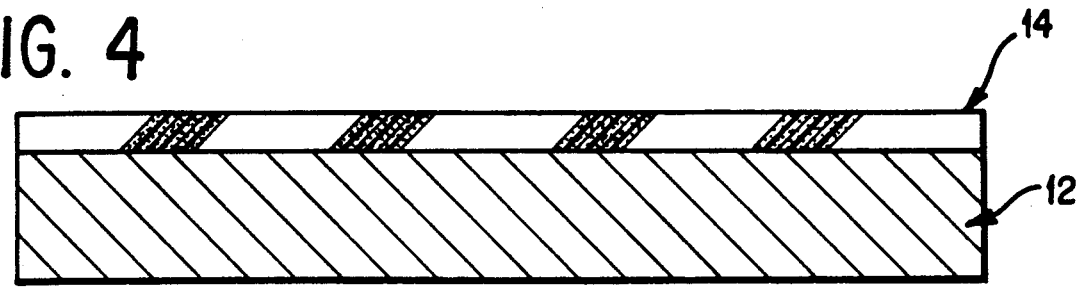
FIG. 4 is a view of the developer sheet of FIG. 2 after coalescing to provide a matte finish.

After developing the image 16, the developer sheet 10 is subjected to the process of the present invention to gloss the thermoplastic developer resin on the developer sheet. By varying the process temperature, degrees of gloss ranging from matte to low gloss to high gloss can be obtained. For example, FIG. 3 schematically illustrates a high gloss finish on the developer sheet 10. The thermoplastic developer resin 14 is essentially completely coalesced into a thin, continuous, translucent film. An intermediate degree of gloss is schematically shown in FIG. 4 in which partial coalescence of the layer 14 gives a finish which is glossier than the uncoalesced intermediate of FIG. 2, but less glossy than the finish of FIG. 3. Where the developer sheet is to be used as a transparency, the support film is transparent and complete coalescence of the developer resin is used.

The thermoplastic developer resins useful in the present invention are known, and have known softening points typically ranging from about 100° to 200° C. Those skilled in the art will appreciate that materials with higher and lower melting points may also be useful, but preferably the particular resins used will have a melting range of about 120° to 130° C. The particle size of the resin particles is preferably in the range of about 0.5 to 25 microns. Examples of appropriate materials can be found in U.S. Pat. No. 4,554,235, which is hereby incorporated by reference.

Figure 5:
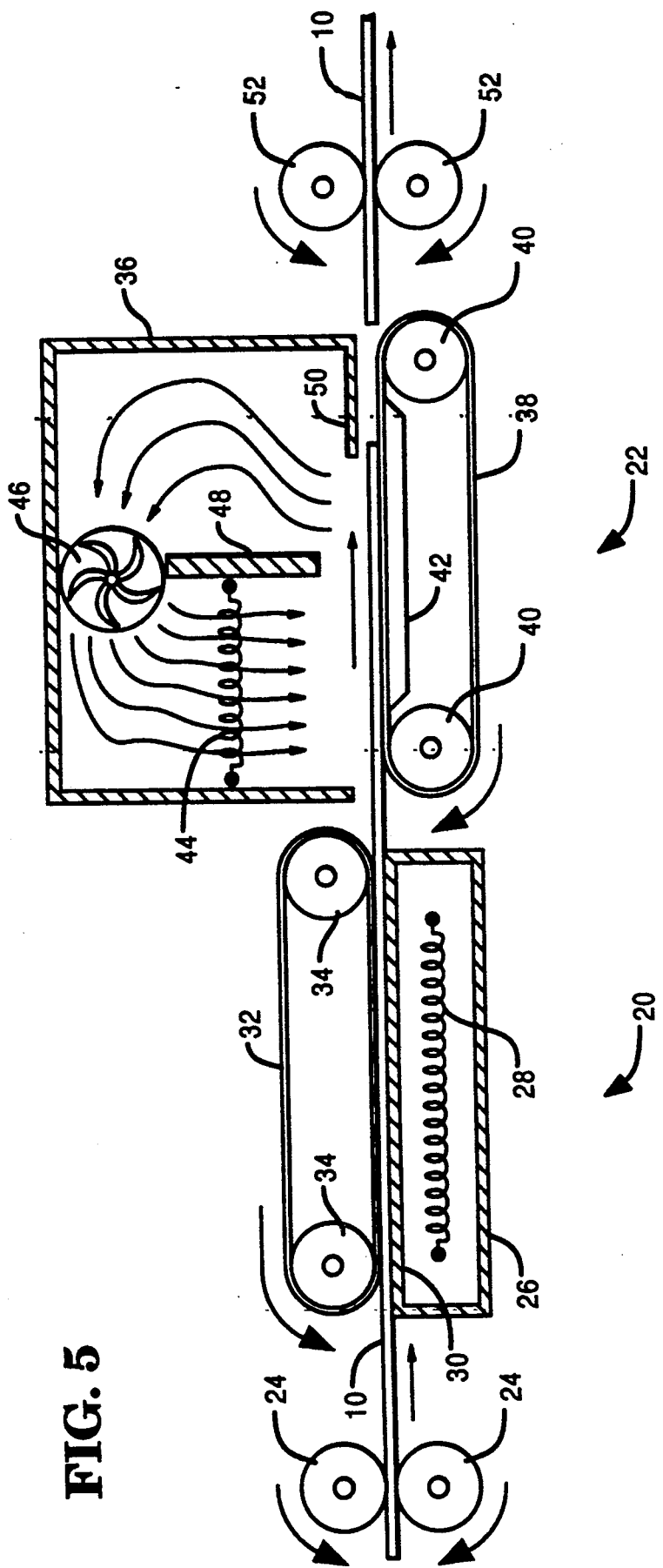
FIG. 5 is a view of an apparatus in accordance with the present invention.

FIG. 5 illustrates a preferred apparatus for glossing a receiver sheet in accordance with the present invention. The invention is premised on the recognition that most of the energy, approximately 80%, of that required for glossing is needed to heat the sheet from its ambient temperature to a temperature just below the melting point of the resin. Thus, the apparatus comprises two stages, a first designated in FIG. 5 generally as 20, wherein the sheet is heated primarily by conductive heating, and a second designated generally by 22, wherein the sheet is heated by a non-contact method, preferably by heated forced air.

A sheet 10 is initially directed to the first stage 20 by a pair of sheet transfer rolls 24. The sheet is moved by rollers 24 onto a heated platen 26, which may preferably be a hollow structure containing therein a heating element 28. In accordance with one embodiment of the invention, the platen surface 30 of structure 26 may be a metallic plate to provide efficient heat conductivity. The sheet 10 is moved across the platen surface 30 by a belt 32 which extends about a pair of rollers 34. As an alternative, platen structure 26 may be constructed with an arched platen surface 30, as is shown for example in U.S. Pat. No. 4,761,311, which is hereby incorporated by reference.

Heating of the sheet is effected by both belt 32, which is heated by its contact with surface 30, and by the surface 30 itself. However, heating by belt 32 is applied directly to the resin which forms the gloss, while heating by surface 30 must rely upon heat transfer through the sheet substrate. Thus, to provide proper throughput speed, the sheet must be heated in stage 20 by contact with the resin layer, preferably by belt 32. Of course, means other than a belt could be used, and in the case of a belt, heating of the belt could be by means other than contact with a heated platen. For example, a heating element could be mounted within the belt path, or the belt could be moved in contact with a heated plate along its return path.

Because a substantial portion of the heating mechanism is the vaporization of water in the sheet, belt 32 is preferably made from a porous material. In a preferred embodiment, the belt may be constructed of cloth, although other materials may also be used. Heating element 28 is energized to raise the temperature of the sheet, at the time it leaves the platen surface 30, to a temperature which is just below a temperature T, wherein T is the melting temperature of the particular resin used. Preferably, the first stage 20 of the glossing apparatus raises the temperature of the sheet to within 30° C. of the melting temperature, and more preferably raises the temperature of the sheet to within 20° C. of the melting temperatures.

A sheet 10 which emerges from first stage 20 of the glossing apparatus is next directed into second stage 22. This portion includes a housing 36 located above the sheet transport path. Movement of the sheets 10 through second stage 22 is effected by a belt 38 which is passed around rollers 40. A sheet support 42 is located beneath belt 38.

To provide the additional heat required for glossing of the sheet within the second stage 22, a heating element 44 is mounted within housing 36 at a location above belt 38. To provide sufficient heat for glossing the thermoplastic resin, a useful heating element 44 operates at a temperature of about 1250° to 1750° C. A blower 46 is positioned above heating element 44 to blow air through heating element 44 to generate hot air which is uniformly blown onto the sheets 10 passing therebeneath. A useful blower 46 generates an air flow of approximately 0.25 to 3.0 cubic meters per minute of air flow onto the sheets.

A vertical baffle 48 is mounted within housing 36 to define a recirculation path for the heated air. Thus, energy requirements of second stage 22 may be minimized. In addition, a horizontal baffle 50 is located above the final portion of the sheet movement path beneath housing 36. This baffle 50 helps to prevent sheet fluttering resulting from the air flow.

After the glossed sheet 10 passes from second stage 22, it is engaged by a pair of rollers 52 for moving the sheet to an output location.

It will be recognized that other non-contact heating methods may be used within second stage 22. One example is a radiant glosser, with an example of this type of device being shown in U.S. Pat. No. 4,806,733.

The use of non-contact heating in the form of forced air within second stage 22 leaves a clean, undamaged surface on the glossed sheet.

The method and apparatus described herein produce a relatively high throughput rate for sheets which are glossed. Using the preferred apparatus described herein, throughput rates for the glossing device in the order of 1.85 centimeters per second can be achieved.

While the methods herein described, and the forms of apparatus for carrying these methods into effect, constitute preferred embodiments of this invention, it is to be understood that the invention is not limited to these precise methods and forms of apparatus, and that changes may be made therein without departing from the scope of the invention, which is defined in the appended claims.

What is claimed is:

1. A method of glossing an image sheet having a resin layer on one side thereof which glosses at a predetermined temperature T, comprising the steps of:
    placing said sheet with the resin side thereof in contact with a conductive heating means;
    applying heat to the resin side of the sheet to bring the sheet to a temperature just below said temperature T;
    removing the resin side of said sheet from contact with said conductive heating means; and
    applying heat to the resin side of said sheet from a non-contact heating source to raise the temperature of said sheet to a temperature at or above said temperature T.

2. The method as defined in claim 1, wherein said conductive heating means is porous to permit the passage of water vaporized by said heating means therethrough.

3. The method as defined in claim 2, wherein said porous heating means is a porous belt, and wherein heat is applied to the sheet while transporting the sheet with said belt toward said non-contact heating source.

4. The method as defined in claim 1, wherein said non-contact heating source includes means for directing heated air onto the resin side of the sheet.

5. The method as defined in claim 1, wherein said non-contact heating source includes radiant heating means positioned to apply heat to the resin side of the sheet.

6. A method of glossing an image sheet having a resin layer on one side thereof which glosses at a predetermined temperature T, comprising the steps of:
    moving the sheet from a first point to a second point by contacting the resin side of said sheet with a porous heated belt, and simultaneously heating said sheet to a temperature just below said temperature T;
    removing the sheet form said belt;
    moving the sheet form said second point to a third point while directing a stream of heated air onto the moving sheet to raise the temperature of the sheet to a temperature at or above said temperature T.

* * * * *

UNITED STATES PATENT AND TRADEMARK OFFICE
CERTIFICATE OF CORRECTION

PATENT NO. : 5,004,891

DATED : April 2, 1991

INVENTOR(S) : Robert A. Landis

It is certified that error appears in the above-identified patent and that said Letters Patent is hereby corrected as shown below:

```
Column 6, line 26, "form" should read -- from --;
Column 6, line 27, "form" should read -- from --.
```

Signed and Sealed this

Eleventh Day of August, 1992

Attest:

DOUGLAS B. COMER

Attesting Officer     Acting Commissioner of Patents and Trademarks